United States Patent
Kim et al.

(10) Patent No.: US 7,176,123 B2
(45) Date of Patent: Feb. 13, 2007

(54) METHOD FOR MANUFACTURING METAL LINE OF SEMICONDUCTOR DEVICE

(75) Inventors: Yu Chang Kim, Chungcheongbuk-do (KR); Kwang Ok Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/728,812

(22) Filed: Dec. 8, 2003

(65) Prior Publication Data
US 2004/0241983 A1 Dec. 2, 2004

(30) Foreign Application Priority Data
May 30, 2003 (KR) .................. 10-2003-0034843

(51) Int. Cl.
*H01L 21/4763* (2006.01)
(52) U.S. Cl. .................. 438/637; 257/E21.579
(58) Field of Classification Search ........ 438/622–624, 438/634, 636–638, 640, 666, 713, 717, 723–725, 438/737–738, 743–744, 780, 786–787, 789–791, 438/793–794, 901, 948, 950, 952, 970, 976
See application file for complete search history.

(56) References Cited

U.S. PATENT DOCUMENTS

| | | | | |
|---|---|---|---|---|
| 5,702,982 | A * | 12/1997 | Lee et al. ................ | 438/620 |
| 6,251,774 | B1 * | 6/2001 | Harada et al. ............ | 438/637 |
| 6,284,657 | B1 | 9/2001 | Chooi et al. | |
| 6,297,149 | B1 * | 10/2001 | Stamper ................... | 438/637 |
| 6,319,821 | B1 * | 11/2001 | Liu et al. ................ | 438/636 |
| 6,323,123 | B1 * | 11/2001 | Liu et al. ................ | 438/638 |
| 6,362,093 | B1 * | 3/2002 | Jang et al. .............. | 438/633 |
| 6,365,529 | B1 * | 4/2002 | Hussein et al. .......... | 438/780 |
| 6,426,298 | B1 * | 7/2002 | Chen et al. .............. | 438/699 |
| 6,461,955 | B1 * | 10/2002 | Tsu et al. ................ | 438/618 |
| 6,465,340 | B1 * | 10/2002 | Wang et al. ............. | 438/622 |
| 6,465,358 | B1 * | 10/2002 | Nashner et al. .......... | 438/700 |
| 6,472,306 | B1 * | 10/2002 | Lee et al. ................ | 438/623 |
| 6,492,270 | B1 | 12/2002 | Lou | |
| 6,514,860 | B1 * | 2/2003 | Okada et al. ............ | 438/687 |
| 6,521,524 | B1 * | 2/2003 | Wang et al. ............. | 438/637 |
| 6,528,409 | B1 | 3/2003 | Lopatin et al. | |
| 6,589,711 | B1 * | 7/2003 | Subramanian et al. ..... | 430/311 |
| 6,589,881 | B2 * | 7/2003 | Huang et al. ............ | 438/725 |
| 6,642,153 | B1 * | 11/2003 | Chang et al. ............ | 438/725 |
| 6,720,256 | B1 * | 4/2004 | Wu et al. ................ | 438/638 |
| 6,743,713 | B2 * | 6/2004 | Mukherjee-Roy et al. .. | 438/638 |
| 6,828,245 | B2 * | 12/2004 | Chang ..................... | 438/709 |
| 2002/0192945 | A1 * | 12/2002 | Nagahara ................ | 438/637 |
| 2003/0109131 | A1 * | 6/2003 | Ma ......................... | 438/637 |
| 2003/0166345 | A1 * | 9/2003 | Chang ..................... | 438/717 |
| 2003/0216026 | A1 * | 11/2003 | Mukherjee-Roy et al. .. | 438/622 |

(Continued)

*Primary Examiner*—Alexander Ghyka
(74) *Attorney, Agent, or Firm*—Heller Ehrman LLP

(57) ABSTRACT

The present invention discloses methods for manufacturing a metal line of a semiconductor device that can prevent undesirable etching of an edge of an interlayer insulating film. In accordance with the method, a lower metal line exposed by a via contact hole is covered by a photoresist film pattern which is formed via an exposure and development process using an upper metal line mask. An etching process is performed using the photoresist film pattern as a mask to form the upper metal line region that is then filled to form an upper metal line after removing the photoresist film pattern.

7 Claims, 7 Drawing Sheets

U.S. PATENT DOCUMENTS

2003/0216036 A1* 11/2003 Ma .............................. 438/637
2004/0038518 A1* 2/2004 Chung ........................ 438/631
2004/0092098 A1* 5/2004 Sudijono et al. ............ 438/637
2004/0121578 A1* 6/2004 Nam .......................... 438/622

* cited by examiner

METHOD FOR MANUFACTURING METAL LINE OF SEMICONDUCTOR DEVICE

BACKGROUND OF THE INVENTION

1. Field of the Invention

The present invention relates to a method for manufacturing a metal line of a semiconductor device, and in particular to an improved method for manufacturing metal line of semiconductor device wherein undesirable etching of an edge of an interlayer insulating film which causes electrical shorts between metal lines can be prevented.

2. Description of the Background Art

A semiconductor device includes a plurality of vertically stacked electrical wiring layers and connection layers connecting vertically stacked electrical wiring layers.

In case of logic devices, gates and metal layers correspond to the electrical wiring layers, and contact hole layers connecting gates and metal layers and via contact hole layers connecting upper and lower wiring layers correspond to the connection layers.

In accordance with a conventional method for manufacturing metal line of semiconductor device, a metal line is formed on a planarized surface and an interlayer insulating film planarizing the entire surface is then formed. However, this method is disadvantageous in that the patterning of metal lines having microscopic widths is very difficult.

A new method, namely a damascene method wherein a interlayer insulating film having a groove for metal line is formed on a planarized surface and the groove is filled with metal have been proposed to overcome the disadvantages of the conventional method, which is described hereinbelow.

FIGS. 1a through 1e are cross-sectional diagrams illustrating a conventional damascene method for manufacturing metal line of semiconductor device.

Referring to FIG. 1a, a lower structure such as a device isolation film (not shown) defining an active region, a word line (not shown), a bit line (not shown) and a capacitor (not shown) are formed on a semiconductor substrate (not shown). A lower insulating layer (not shown) is deposited to planarize the entire surface.

Thereafter, a lower metal line 11 connected to the lower structure is deposited on the lower insulating layer using copper. A first insulating film 13 exposing a top surface of the lower metal line 11 is then formed on the entire surface.

Next, a stacked structure of a first etch barrier film 15, a second interlayer insulating film 17, a second etch barrier film 19, a third interlayer insulating film 21 and a hard mask layer 23 is formed on the entire surface. The stacked structure is then etched via a photolithography process using metal line contact mask (not shown), i.e. via contact mask (not shown) to expose the first etch barrier film 15.

Now referring to FIG. 1b, an organic anti-reflection film 27 is deposited on the entire surface. Thereafter, a photoresist pattern 29 is formed on the organic anti-reflection film 27. The photoresist pattern 29 is formed via exposure and development process using metal line mask.

Referring to FIG. 1b, the organic anti-reflection film 27, the hard mask layer 23 and the third interlayer insulating film 21 are etched using the photoresist pattern 29 as a mask to expose the second etch barrier film 19. The organic anti-reflection film 27 remains between the second interlayer insulating film and the first etch barrier film 15.

Now referring to FIG. 1d, the photoresist pattern 29 and the organic anti-reflection film 27 are sequentially removed to expose the first etch barrier film 15 on the lower metal line 11.

Referring to FIG. 1e, the exposed portion of the first etch barrier film 15 is removed via an etch-back process to form an upper metal line region 31 for contacting the lower metal line 11. The etch-back process is performed without using a mask, wherein the edges of the second etch barrier film 19, the second interlayer insulating film 17, and the hard mask layer 23 are etched to have a shape denoted as 'A' in FIG. 1e.

The edges having the shape denoted as 'A' in FIG. 1e has an effect of reducing the distance between the upper metal lines to cause shorts between the upper metal lines. The short between the upper metal lines degrades the electrical characteristic of metal lines.

FIG. 2 is a SEM photograph showing copper lines manufactured in accordance with the conventional method. As can be seen from FIG. 2, the critical dimension between the copper lines is reduced.

SUMMARY OF THE INVENTION

Accordingly, it is an object of the present invention to provide a method for manufacturing metal line of semiconductor device wherein a lower metal line exposed through a via contact hole is covered by a photoresist pattern so that the edge of an interlayer insulating film at the top corner of the via contact hole is not etched during a formation process of upper metal line region to prevent the reduction of distance between metal lines which causes short between the metal lines.

In order to achieve the above-described object of the invention, there is provided a method for manufacturing metal lines of semiconductor device, the method comprising the steps of: forming a first interlayer insulating film exposing a top portion of a lower metal line on a semiconductor substrate; forming a stacked structure of a first etch barrier film, a second interlayer insulating film, a second etch barrier film, a third interlayer insulating film and an anti-reflection film; etching the stacked structure to form a via contact hole exposing a portion of the first interlayer insulating film on the lower metal line; removing the exposed portion of the first interlayer insulating film to expose the lower metal line; forming a photoresist film on the entire surface; subjecting the photoresist film to an exposure and development process using an upper metal line mask to form a photoresist film pattern for defining an upper metal line region, wherein the photoresist film pattern further fills a portion of the via contact hole; etching the anti-reflection film and the third interlayer insulating film using the photoresist film pattern as a mask to form the upper metal line region; removing the photoresist film pattern; and forming an upper metal line contacting the lower metal line by filling the upper metal line region.

BRIEF DESCRIPTION OF THE DRAWINGS

The present invention will become better understood with reference to the accompanying drawings that are given only by way of illustration and thus are not limitative of the present invention, wherein.

DETAILED DESCRIPTION OF THE PREFERRED EMBODIMENTS

A method for manufacturing metal line of semiconductor device in accordance with a preferred embodiment of the present invention will now be described in detail with reference to the accompanying drawings.

FIGS. 3a through 3e are cross-sectional diagrams illustrating a method for manufacturing metal lines of semiconductor device in accordance with the present invention.

Figure 1A:
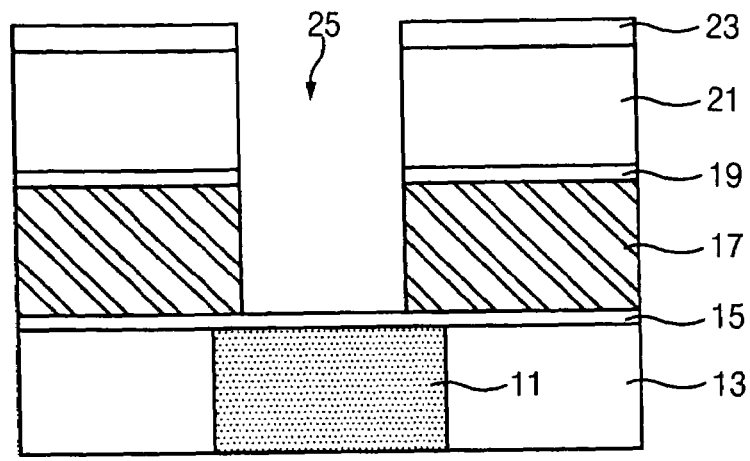
FIGS. 1a through 1e are cross-sectional diagrams illustrating a conventional damascene method for manufacturing metal lines of semiconductor device.
Figure 1B:
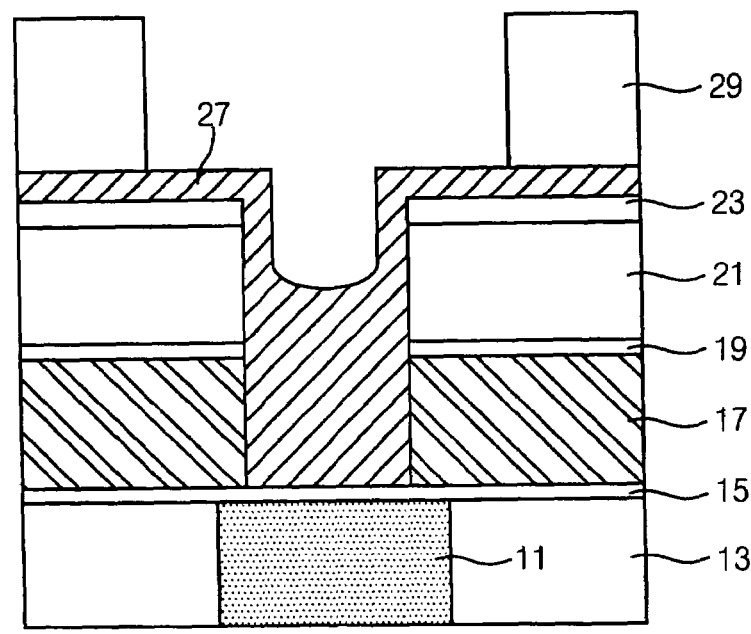
Figure 1C:
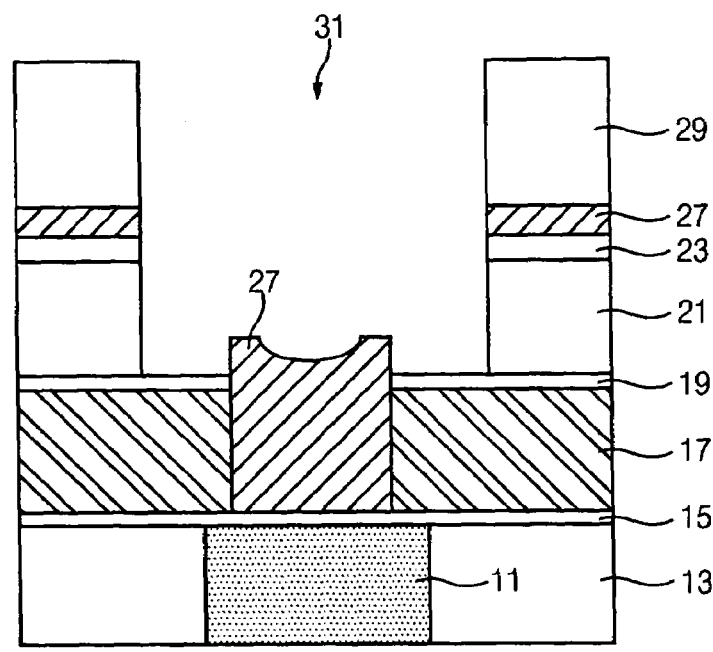
Figure 1D:
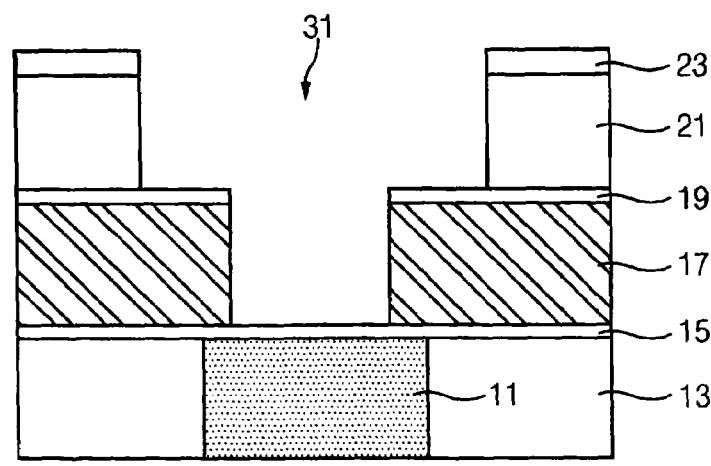
Figure 1E:
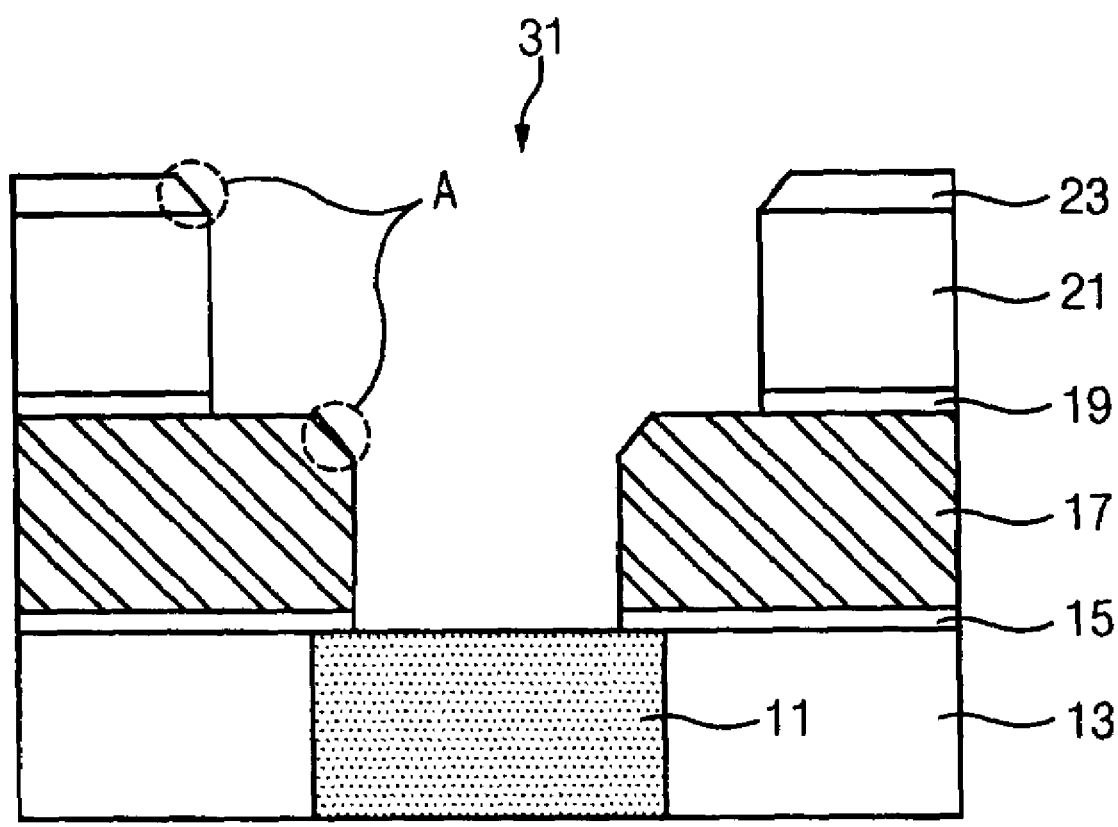
Figure 2:
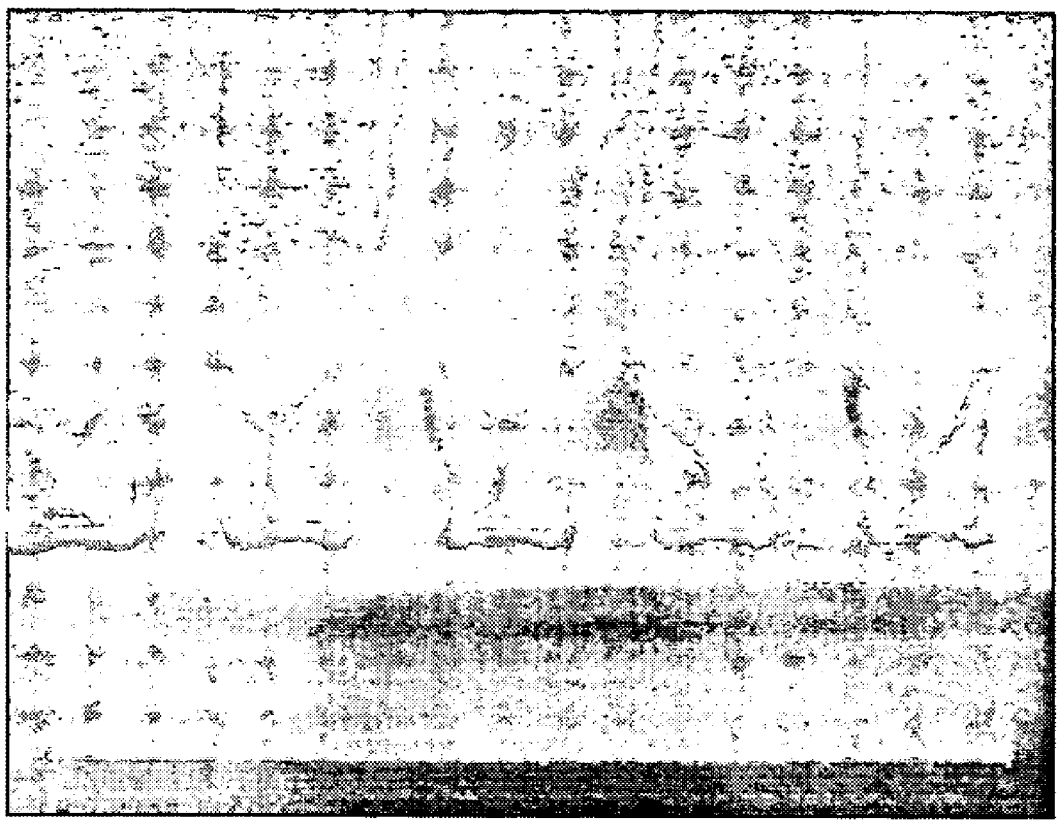
FIG. 2 is a SEM photograph showing metal lines manufactured in accordance with the conventional method.
Figure 3A:
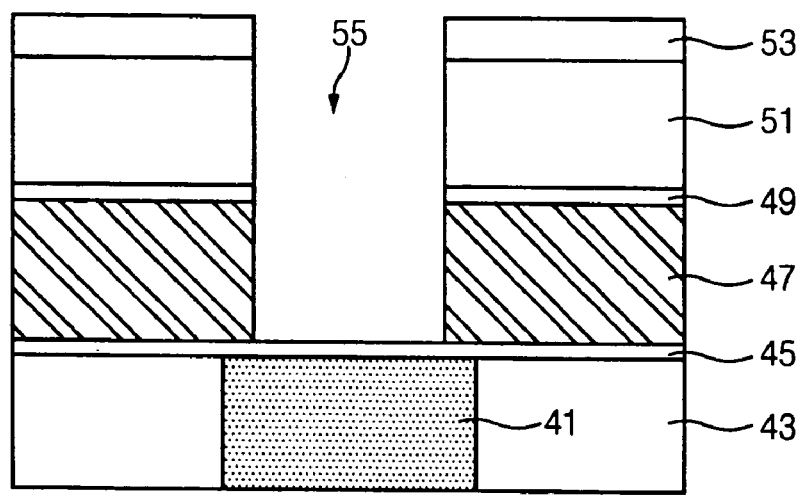
FIGS. 3a through 3e are cross-sectional diagrams illustrating a method for manufacturing metal lines of semiconductor device in accordance with the present invention.

Referring to FIG. 3a, a lower structure such as a device isolation film (not shown) defining an active region, a word line (not shown), a bit line (not shown) and a capacitor (not shown) are formed on a semiconductor substrate (not shown). A lower insulating layer (not shown) is then deposited to planarize the entire surface.

Thereafter, a lower metal line 41 connected to the lower structure is deposited on the lower insulating layer preferably using copper. A first insulating film 43 exposing a top surface of the lower metal line 41 is then formed to planarize the entire surface.

Next, a first etch barrier film 45 is formed on the entire surface. The first etch barrier film 45 serves as a capping layer for copper and preferably comprises an insulating film, for example SiN film, SiC film or SiCN film.

Still referring to FIG. 3a, a second interlayer insulating film 47 is formed on the first etch barrier film 45. In one embodiment, the second interlayer insulating film 47 preferably comprises a film selected from the group consisting of an oxide film, an organic low-k film, an organic porous low-k film and combinations thereof. In another embodiment, the second interlayer insulating film 47 preferably comprises a silica-base low-k film or a silica-base porous low-k film.

Thereafter, a second etch barrier film 49 and a third interlayer insulating film 51 are sequentially deposited on the second interlayer insulating film 47. The third interlayer insulating film 51 preferably consists of the same material as the first etch barrier film 45.

Next, an anti-reflection film 53 is formed on the third interlayer insulating film 51. Preferably, the anti-reflection film 53 comprises SiON inorganic anti-reflection film. The thickness of the anti-reflection film 53 is determined by considering the thickness of the anti-reflection film 53 etched during the etching process of the first and the second etch barrier films. For example, when an anti-reflection film 53 having a thickness of 600 Å is required and thickness of about 400 Å is etched during the etching process, initial thickness of the anti-reflection film 53 should be about 1000 Å.

The anti-reflection film 53, the third interlayer insulating film 51, the second etch barrier film 49 and the second interlayer insulating film 47 are etched via a photolithography process using metal line contact mask (not shown), i.e. via contact mask (not shown) to form a via contact hole 55 exposing the first etch barrier film 45.

Figure 3B:
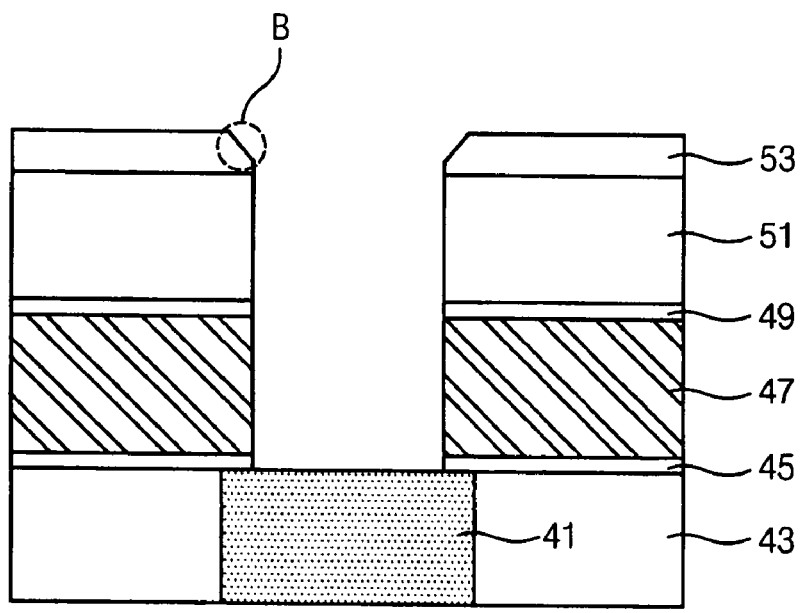

Referring to FIG. 3b, the exposed portion of the first etch barrier film 45 at the bottom of the via contact hole 55 is removed via an etching process. Portions of the anti-reflection film 53, i.e. a top and edge portions of the anti-reflection film 53 are etched in the etching process of the first etch barrier film 45. As a result, the thickness of the anti-reflection film 53 is reduced and the edge portion of the anti-reflection film 53 at the top corner of the via contact hole 55 is etched to have a shape denoted as 'B' in FIG. 3b.

Figure 3C:
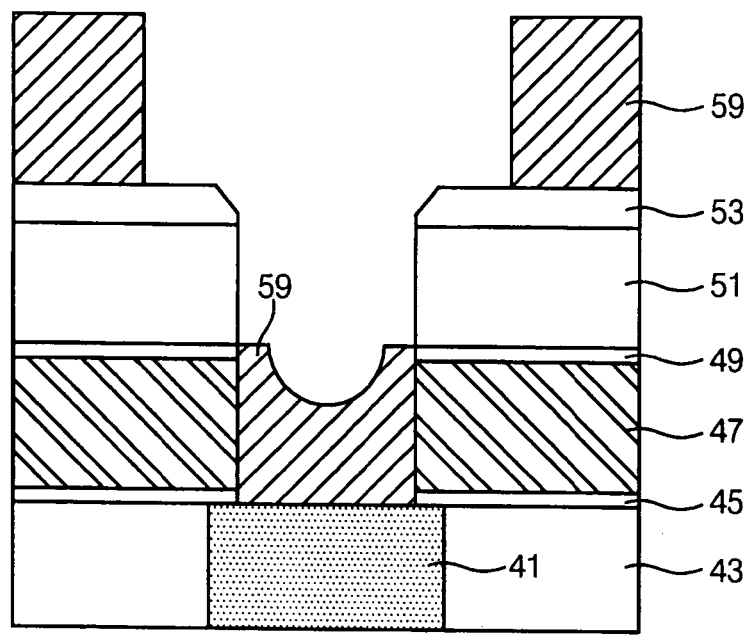

Now referring to FIG. 3c, a photoresist film (not shown) is formed on the entire surface and the photoresist film is exposed and developed using a metal line mask (not shown) to form a photoresist film pattern 59. A portion of the photoresist film remains at the bottom of the via contact hole 55 so that the photoresist film pattern 59 covers the lower metal line 41.

When the photoresist film pattern 59 at the bottom of the via contact hole 55 does not sufficiently fill the bottom of the via contact hole 55, i.e. when the thickness of the photoresist film pattern 59 at the bottom of the via contact hole 55 is not sufficient, the lower metal line 41 may be damaged or contaminated in the subsequent etching process. In order to prevent the damage or contamination of the lower metal line, the photoresist film pattern 59 at the bottom of the via contact hole 55 should have a sufficient thickness.

Figure 3D:
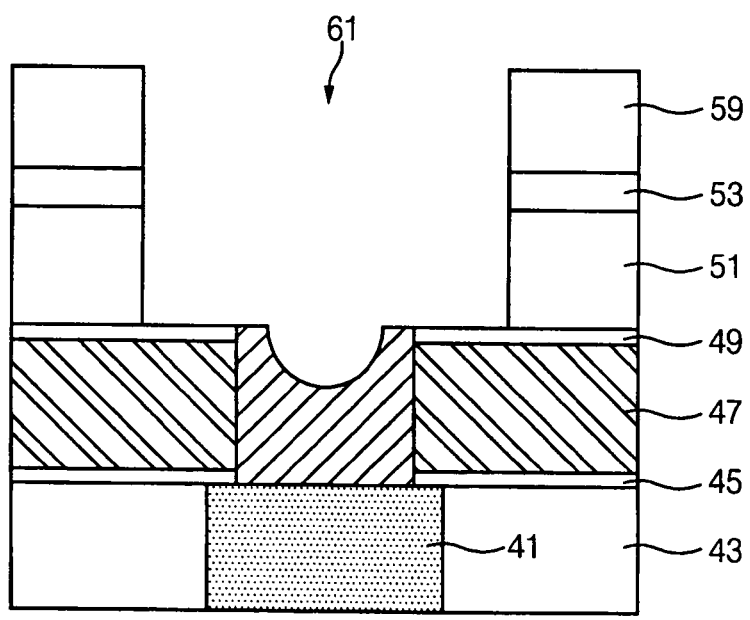

Referring to FIG. 3d, the anti-reflection film 53 and the third interlayer insulating film 51 are etched using the photoresist film pattern 59 as a mask to form upper metal line region 61. It is preferable that the anti-reflection film 53 and the third interlayer insulating film 51 are plasma-etched using a mixture gas of $CF_4/O_2/Ar$.

Figure 3E:
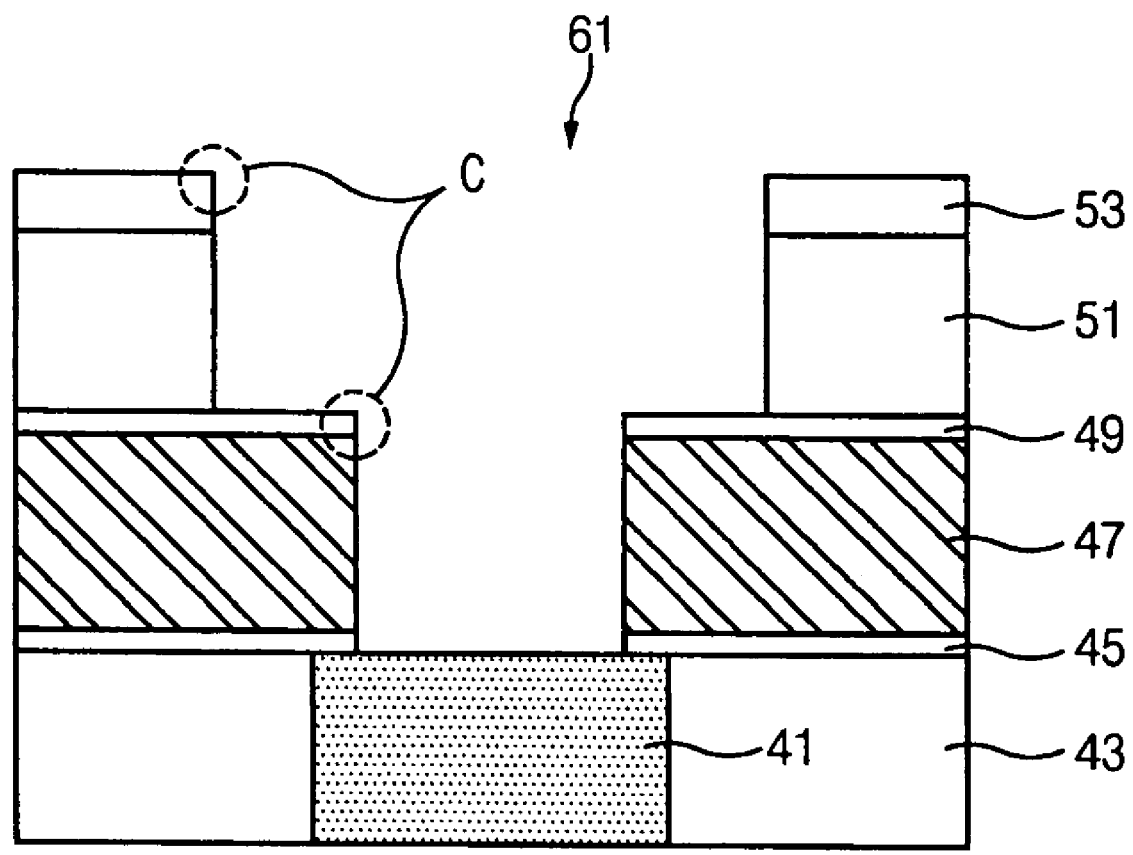

Referring to FIG. 3e, the portion of the photoresist film pattern 59 in the via contact hole 55 is removed preferably by performing an in-situ plasma-etching process using a mixture gas of $CF_4/O_2/Ar$. The remaining portion of the photoresist film pattern 59 is then removed. Edge portions of the anti-reflection film 53 and the second etch barrier film 49 in the upper metal line region 61, which are denoted as 'C' in FIG. 3e, are not etched.

Thereafter, the upper metal line region 61 is filled to form an upper metal line (not shown).

As discussed earlier, in accordance with the present invention, the lower metal line exposed through the via contact hole is covered by the photoresist pattern so that the edge of an interlayer insulating film at the top corner of the via contact hole is not etched during a formation process of upper metal line region. This prevents short between the metal lines caused by the reduction of distance therebetween, thereby improving the electrical characteristics of semiconductor device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing metal lines of a semiconductor device, the method comprising the steps of:

forming a first interlayer insulating film exposing a top portion of a lower metal line on a semiconductor substrate;

forming a stacked structure of a first etch barrier film, a second interlayer insulating film, a second etch barrier film, a third interlayer insulating film, and an anti-reflection film;

etching the stacked structure to form a via contact hole exposing a portion of the first etch barrier film on the lower metal line;

removing the exposed portion of the first etch barrier film to expose the lower metal line;

forming a photoresist film on the entire surface of the exposed lower metal line, the via contact hole, and the remaining anti-reflection film;

subjecting the photoresist film to an exposure and development process using an upper metal line mask to form a photoresist film pattern for defining an upper metal line region, wherein the photoresist film pattern further fills a portion of the via contact hole to cover the exposed lower metal line;

etching the anti-reflection film and the third interlayer insulating film using the photoresist film pattern as a mask to form the upper metal line region;

removing the photoresist film pattern to expose the lower metal line;

after the photoresist film pattern is removed, forming an upper metal line contacting the lower metal line by filling the upper metal line region.

2. The method according to claim 1, wherein the first and the second etch barrier films comprise a film selected from the group consisting of SiN film, SiC film and SiCN film, respectively.

3. The method according to claim 1, wherein the second and the third interlayer insulating films comprise a film selected from the group consisting of a silica-base low-k film and a silica-base porous low-k film, respectively.

4. The method according to claim 1, wherein the second and the third interlayer insulating films comprise a film selected from the group consisting of an oxide film, an organic low-k film, an organic porous low-k film and combinations thereof, respectively.

5. The method according to claim 1, wherein the anti-reflection film comprises a SiON inorganic anti-reflection film.

6. The method according to claim 1, wherein the step of etching the anti-reflection film and the third interlayer insulating film is a plasma etching process using a mixture gas of $CF_4/O_2/Ar$.

7. The method according to claim 6, wherein the step of removing the photoresist film pattern in the via contact hole is performed in an in-situ manner.

* * * * *